United States Patent
Chen

(10) Patent No.: US 7,084,391 B1
(45) Date of Patent: Aug. 1, 2006

(54) IMAGE SENSING MODULE

(75) Inventor: Wen Ching Chen, No. 170-3, Cingsong St., Dali City, Taichung County 412 (TW)

(73) Assignees: Wen Ching Chen, Taichung (TW); Exquisite Optical Technology Co., Ltd., Taichung Hsien (TW)

( * ) Notice: Subject to any disclaimer, the term of this patent is extended or adjusted under 35 U.S.C. 154(b) by 0 days.

(21) Appl. No.: 11/098,443

(22) Filed: Apr. 5, 2005

(51) Int. Cl.
*H01L 31/02* (2006.01)

(52) U.S. Cl. .................. 250/239; 250/216; 250/208.1; 257/433; 257/678; 348/374

(58) Field of Classification Search ................ 250/216, 250/208.1, 239; 257/431–434, 678, 680, 257/690, 778, 693, 696, 784; 359/811–816; 348/340, 374; 438/106; 358/474, 484

See application file for complete search history.

(56) References Cited

U.S. PATENT DOCUMENTS

| | | | | |
|---|---|---|---|---|
| 4,055,761 A * | 10/1977 | Shimomura | ................. | 250/239 |
| 5,877,546 A * | 3/1999 | You | ............................ | 257/680 |
| 6,654,064 B1 * | 11/2003 | Ishikawa | ..................... | 348/374 |
| 6,759,642 B1 * | 7/2004 | Hoshino | ................... | 250/208.1 |
| 6,798,053 B1 * | 9/2004 | Chiu | ........................... | 257/684 |
| 6,870,208 B1 * | 3/2005 | You et al. | .................... | 257/291 |
| 6,900,429 B1 * | 5/2005 | Bai et al. | ..................... | 250/239 |
| 6,940,058 B1 * | 9/2005 | Shiau | ....................... | 250/208.1 |
| 7,030,471 B1 * | 4/2006 | Perillat | ....................... | 257/666 |
| 2003/0128442 A1 * | 7/2003 | Tanaka et al. | ............... | 359/819 |
| 2004/0150740 A1 * | 8/2004 | Hsin | .......................... | 348/340 |
| 2004/0212055 A1 * | 10/2004 | Exposito et al. | ............ | 257/678 |
| 2006/0006511 A1 * | 1/2006 | Roh et al. | .................... | 257/680 |

* cited by examiner

*Primary Examiner*—Stephone B. Allen
*Assistant Examiner*—Davienne Monbleau
(74) *Attorney, Agent, or Firm*—Rosenberg, Klein & Lee

(57) ABSTRACT

An image sensing module includes a base with an image sensor and a lens assembly connected to the base. A plurality of inner legs are located on a stepped portion between the upper hole and a lower hole in the base. The inner legs extend outward to form outer legs so as to be connected to the circuit board. The image sensor is composed of an image sensing chip connected to a glass plate by way of "Flip Chip". The glass plate is supported on the stepped portion and the inner legs on the stepped portion are connected to the wires on the glass plate. The lens assembly secures the image sensor in the upper hole so that the image sensing module is slim and easily to be manufactured.

9 Claims, 5 Drawing Sheets

IMAGE SENSING MODULE

FIELD OF THE INVENTION

The present invention relates to an image sensing module, and more particularly, to a slim image sensing module that is easily manufactured and assembled.

BACKGROUND OF THE INVENTION

A conventional image sensing module is disclosed in FIG. 7 and generally includes a chip base 81 with an image sensing chip 82 connected thereon and the legs 811 of the base 81 are connected to the chip 82 by wires. A frame 83 and a glass plate 84 pack the base 81 so as to form the image sensor 8. The image sensing sensor 8 includes a lens assembly 91 which includes a lens tube 92 with lenses 93 therein.

Due to the connection by wires between the image sensor 8 and the chip 82, the processes for manufacturing are complicated and the image sensor 8 cannot reach a satisfied thickness.

FIG. 8 shows a Taiwanese publish number 572528 which discloses a plurality of metal plates 72 on a base 71 which has a recess 73 defined in an underside thereof. An image sensing chip 74 is received in the recess 73 and are electrically connected to the metal plates 72. A chamber 75 communicates with the recess 73 and a glass plate 76 is connected to the under side of the chamber 75 and a lens tube 77 is threadedly connected to the chamber 75. The lens tube 77 includes lenses 78 so as to form the image sensing module.

The disclosed module directly pack the chip 74 to the base 71 without the frame and the chip base so as to reduce the thickness of the module.

However, the image sensing area of the chip 74 is located close to one side of the glass plate 76. In other words, the image sensing area of the chip 74 is exposed to air before the glass plate 76 is mounted so that the image sensing area of the chip 74 might be contaminated. The chip 74 is sent to test after it is packed within the bas 71, once a defect is found in the chip 74, the whole assembly of the chip 74 and the base 71 have to be discarded. There are several steps to install the chip 74 in the recess 73 of the base 71 and to cover the glass plate 76 onto the chamber 75, too many steps are required. A flange 79 is located between the recess 73 and the chamber 75 so as to allow the glass plate 76 to be engaged with the chamber 75, the thickness of the flange 79 contributes a certain thickness of the module.

A technique called "Flip Chip" is used widely in the Liquid Crystal Device monitors and relates to a technique to directly connected the chip on the glass plate. Wires are arranged on the glass plate to be connected with the chip and the wires are as thin as 3.5 mm$^2$ and are as many as billions of wires. Although the technique of "Flip Chip" can be used in the image sensing module, and the chip can be directly connected on the glass plate to reduce the thickness, the wires are so thin which are difficult to be connected to the circuit boards (PCB or FPC). Therefore, there is not such application used in the image sensing modules.

The present invention intends to provide an image sensing module that uses the technique of "Flip Chip".

SUMMARY OF THE INVENTION

The present invention relates to an image sensing module that comprises a base and a receiving hole is defined through a center of the base. The receiving hole is composed of an upper hole and a lower hole which has a smaller inner periphery than that of the upper hole so as to define an stepped portion at a conjunction portion between the upper hole and the lower hole. A plurality of inner legs are connected on the stepped portion and extend through the base to form outer legs which are connected to a circuit board. An image sensor has a glass plate and an image sensing chip directly connected on the glass plate. The glass plate is engaged with the upper hole and the chip is received in the lower hole. A plurality of wires are located on a surface of the glass plate that is connected to the image sensor so that the stepped portion supports the glass plate when the image sensor is received in the receiving hole. The inner legs are electrically connected to the wires on the glass plate. A lens assembly has a connection section which is connected with the upper hole of the base to fix the image sensor.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
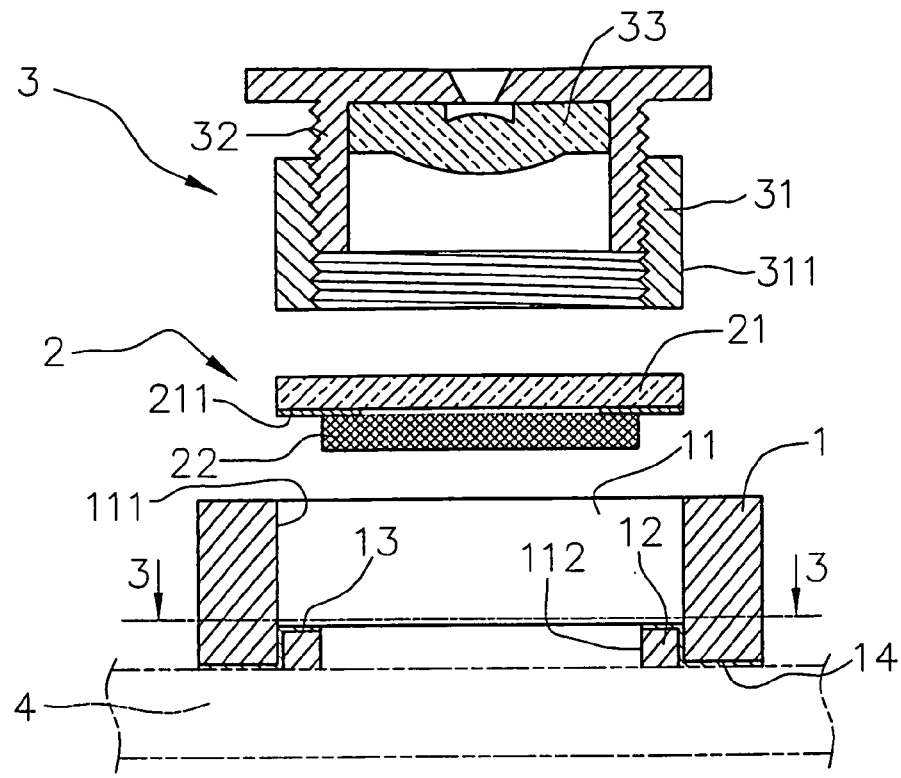
FIG. 1 is an exploded view to show the image sensing module of the present invention.
Figure 2:
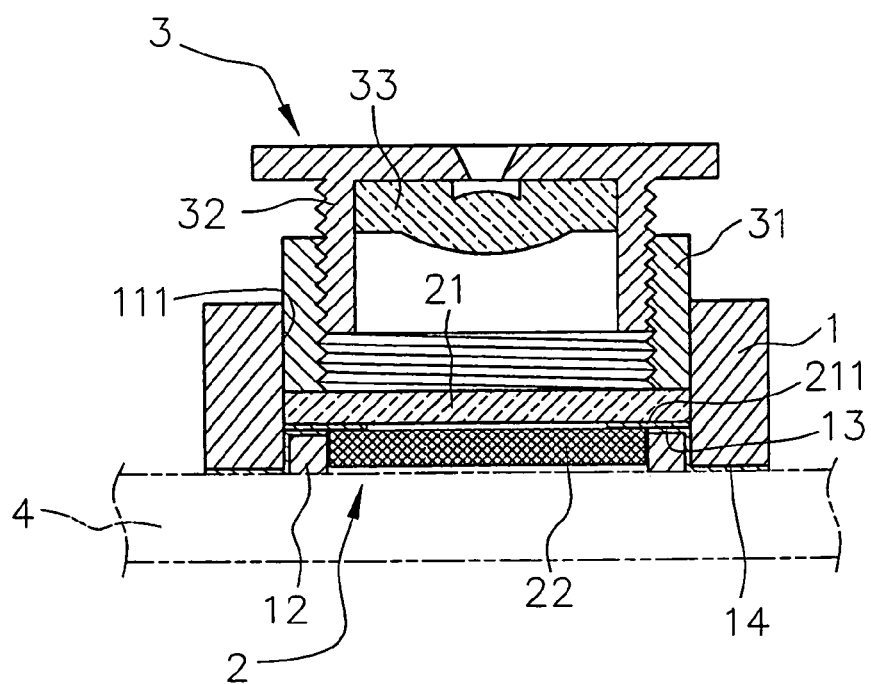
FIG. 2 is a cross sectional view of the image sensing module of the present invention.
Figure 3:
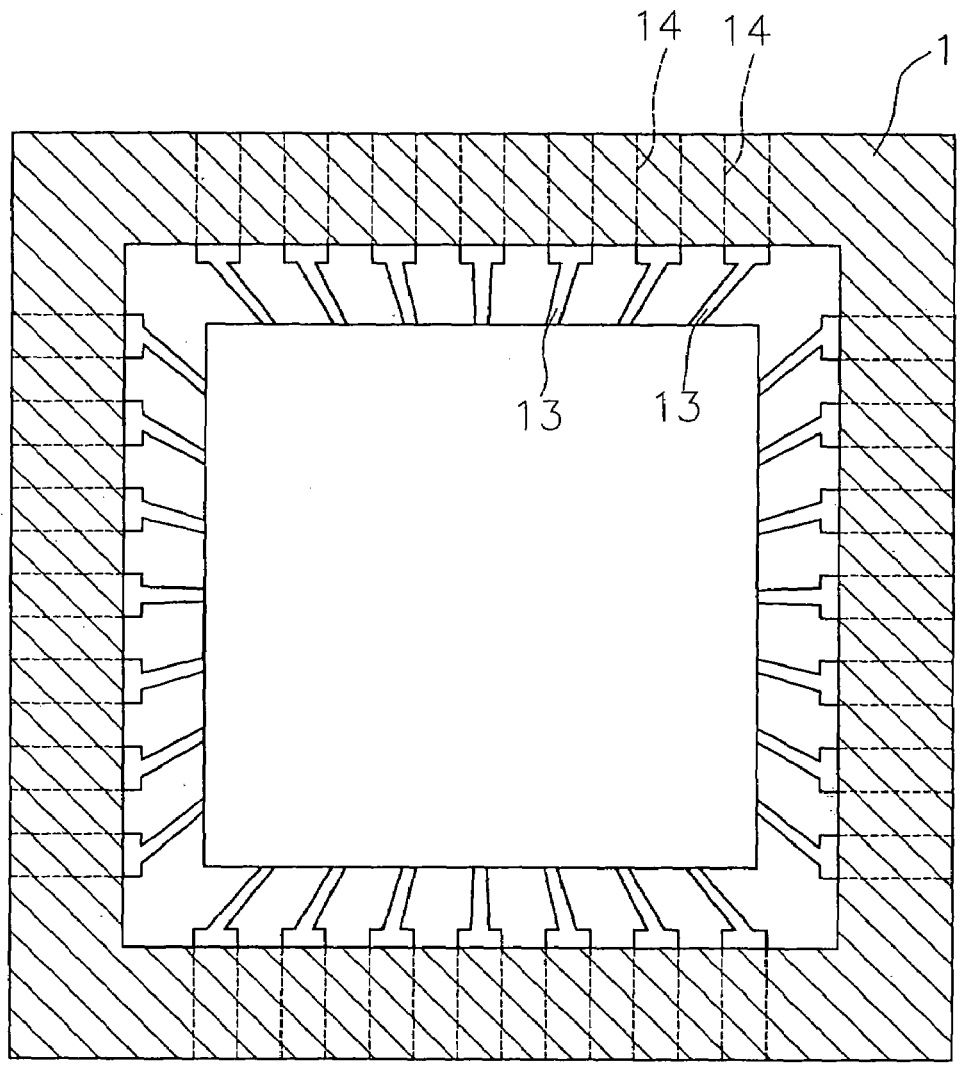
FIG. 3 is a cross sectional view along line 3—3 in FIG. 1.

Referring to FIGS. 1 to 3, the image sensing module of the present invention comprises a base 1 with a receiving hole 11 defined through a center of the base 1 and the receiving hole 11 is composed of an upper hole 111 and a lower hole 112 which has a smaller inner periphery than that of the upper hole 111 so as to define an stepped portion 12 at a conjunction portion between the upper hole 111 and the lower hole 112. A plurality of inner legs 13 are connected on the stepped portion 12 and extend through the base 1 to form outer legs 14 which are connected to a circuit board 4.

An image sensor 2 having a glass plate 21 and an image sensing chip 22 is directly connected on the glass plate 21 by way of "Flip Chip". The glass plate 21 has the same shape of the periphery of the upper hole 111 so that the glass plate 21 is engaged with the upper hole 111 and the chip 22 is received in the lower hole 112. in this embodiment, the periphery of the upper hole 111 and the glass plate are both in shape of rectangle. A plurality of wires 211 are located on a surface of the glass plate 21 that is connected to the image sensor 2 so that the stepped portion 12 supports the glass plate 21 when the image sensor 2 is received in the receiving hole 11. The inner legs 13 are electrically connected to the wires 211 on the glass plate 21.

A lens assembly 3 has a lens base 31 which includes a connection section 311 on an outer periphery thereof and the lens base 31 is connected to a lens tube 32 which includes a lens 33 received therein. The connection section 311 has the same shape of the upper hole 111 so as to be connected with the upper hole 111 of the base 1 to fix the image sensor 2. The lens base 31 and the lens tube 32 are threadedly connected with each other so that the lens tube 32 can be rotated to adjust a distance between the lens 33 and the image sensor 2.

As shown in FIG. 3, in order to improve the difficulties of connection of the module and the circuit board (PCB or FPC), the inner legs 13 on the stepped portion 12 extend outward and beyond the periphery of the base 1 to form the outer legs 14 which are conveniently connected to the circuit board 4 by welding. In other words, the base 1 can be fixed to the circuit board 4 at first stage of the assembling process.

Due to the directly connection of the image sensing chip 22 and the glass plate 21 by "Flip Chip" so that the thickness can be reduced and the chip 22 is avoided from being contaminated.

The stepped portion 12 can be applied with a layer of tin which ensures that the inner legs 13 are electrically connected of the wires on the glass plate 21. The image sensor 2 is fixed by the lens assembly 3 so that once the image sensor 2 is found to include defect portions, the image sensor 2 can be replaced individually.

Figure 4:
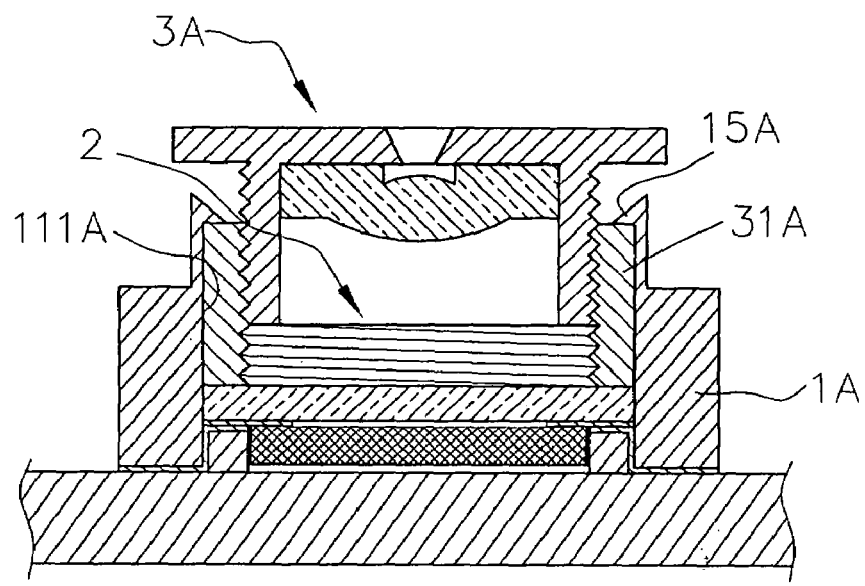
FIG. 4 shows a cross sectional view of a second embodiment of the present invention.

As shown in FIG. 4 which discloses a second embodiment of the present invention, wherein a plurality of hooks 15A are connected to a periphery of the upper hole 111A of the base 1A so as to be hooked to the lens base 31A. By this way, the base 1A, the image sensor 2 and he lens assembly 3A are connected securely.

Figure 5:
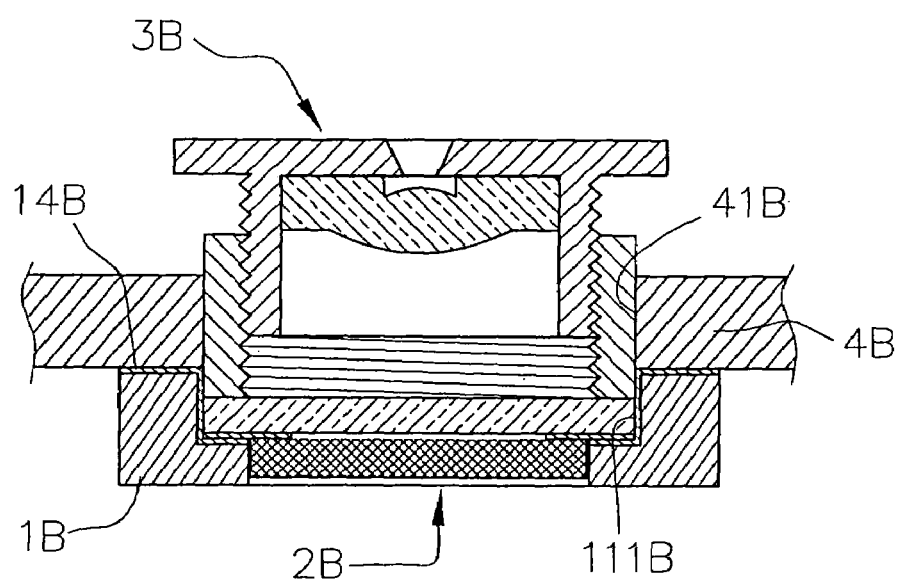
FIG. 5 shows a cross sectional view of a third embodiment of the present invention.

FIG. 5 shows a third embodiment wherein the outer legs 14B extend to a top of the base 1B which is connected to an underside of the circuit board 4B. An opening 41B is defined through the circuit board 4b and located in alignment with the upper hole 111B of the base 1B so that the image sensor 2 and the lens assembly 3 are connected to the upper hole 111B of the base 1B via the opening 41B.

Figure 6:
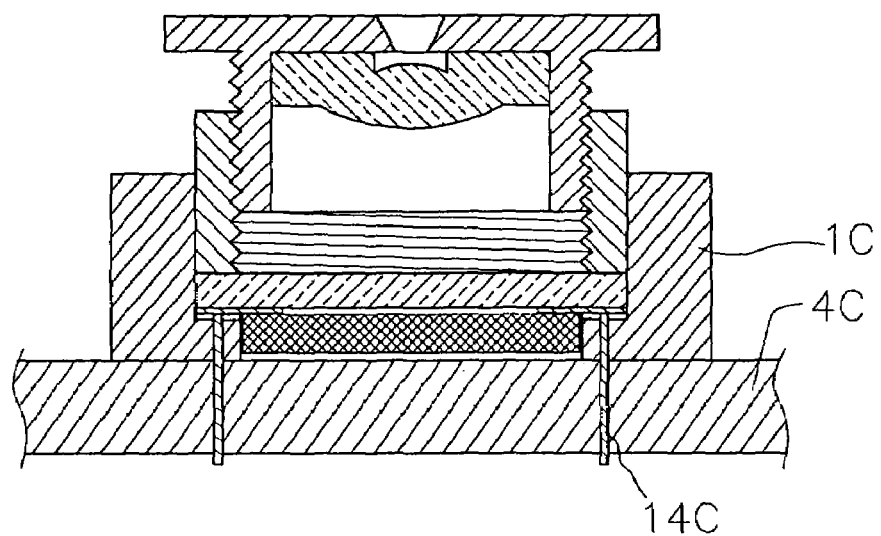
FIG. 6 shows a cross sectional view of a fourth embodiment of the present invention.
Figure 7:
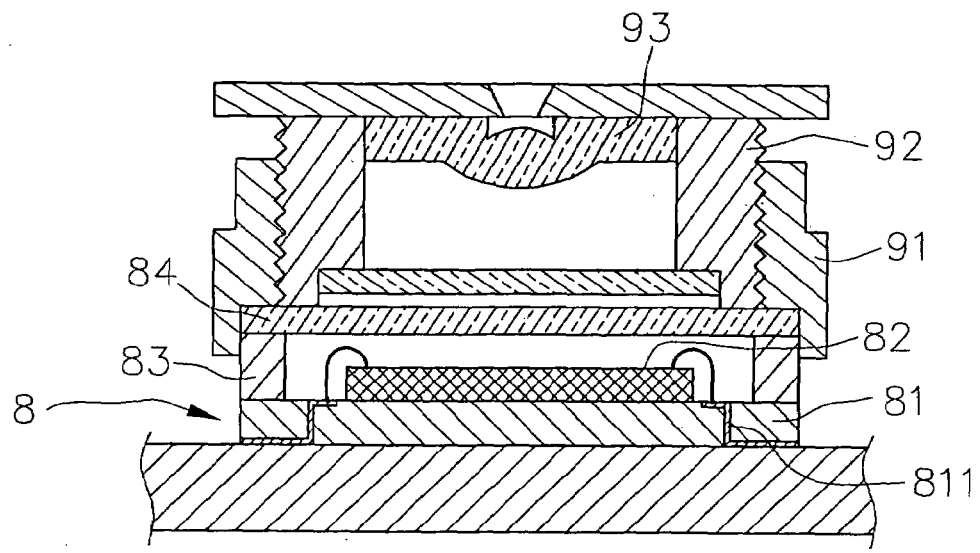
FIG. 7 shows a conventional image sensing module.
Figure 8:
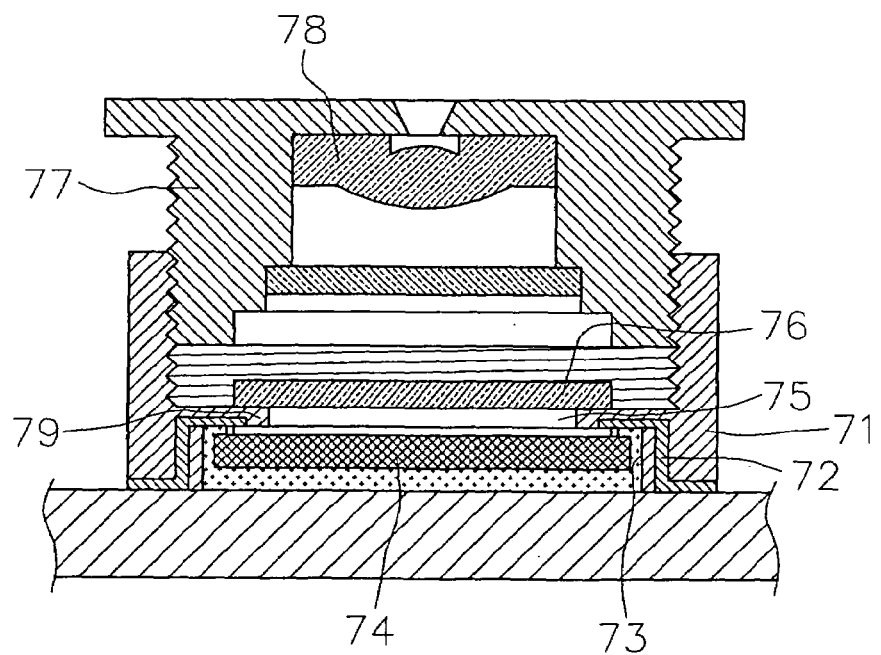
FIG. 8 shows another conventional image sensing module.

FIG. 6 discloses a fourth embodiment wherein the outer legs 14C of the base 1C extend through the base 1C and form legs at the underside of the base 1C so as to be inserted into holes in the circuit board 4C and to be welded to the circuit board 4C from the underside of the circuit board 4C. by this arrangement, the module can be avoided from high temperature.

While we have shown and described the embodiment in accordance with the present invention, it should be clear to those skilled in the art that further embodiments may be made without departing from the scope of the present invention.

What is claimed is:

1. An image sensing module comprising:
   a base with a receiving hole defined through a center of the base and the receiving hole being composed of an upper hole and a lower hole which has a smaller inner periphery than that of the upper hole so as to define an stepped portion at a conjunction portion between the upper hole and the lower hole, a plurality of inner legs connected on the stepped portion and extending through the base to form outer legs which are connected to a circuit board;

an image sensor having a glass plate and an image sensing chip directly connected on the glass plate, the glass plate being engaged with the upper hole and the chip received in the lower hole, a plurality of wires located on a surface of the glass plate that is connected to the image sensor so that the stepped portion supports the glass plate when the image sensor is received in the receiving hole, the inner legs are electrically connected to the wires on the glass plate, and a lens assembly having a connection section which is connected with the upper hole of the base to fix the image sensor.

2. The module as claimed in claim 1, wherein the glass plate and the image sensing chip of the image sensor are connected with each other by way of "Flip Chip".

3. The module as claimed in claim 1, wherein the upper hole and the lower hole each have a rectangular inner periphery, the glass plate, the image sensing chip and the connection section of the lens assembly have a rectangular cross section.

4. The module as claimed in claim 1, wherein lens assembly includes a lens base which includes the connection section on an outer periphery thereof and the lens base is connected to a lens tube which includes a lens received therein.

5. The module as claimed in claim 4, wherein the lens base and the lens tube are threadedly connected with each other, the lens tube is rotated to adjust a distance between the lens and the image sensor.

6. The module as claimed in claim 1, wherein further comprising a plurality of hooks on a periphery of the upper hole of the base so as to be hooked to the lens base.

7. The module as claimed in claim 1, wherein the outer legs extend to an underside of the base which is put on a top of the circuit board.

8. The module as claimed in claim 1, wherein the outer legs extend to a top of the base which is connected to an underside of the circuit board, an opening defined through the circuit board and located in alignment with the upper hole of the base so that the image sensor and the lens assembly are connected to the upper hole of the base via the opening.

9. The module as claimed in claim 1, wherein the outer legs of the base extend through the base and form legs at the underside of the base so as to be inserted into holes in the circuit board and to be welded to the circuit board from the underside of the circuit board.

* * * * *